United States Patent [19]

Minakuchi

[11] 3,961,207

[45] June 1, 1976

[54] OUTPUT RETAINING ELECTRONIC CIRCUIT

[75] Inventor: Hiroshi Minakuchi, Kadoma, Japan

[73] Assignee: Matsushita Electric Industrial Co., Ltd., Japan

[22] Filed: Sept. 20, 1974

[21] Appl. No.: 507,805

[30] Foreign Application Priority Data
Sept. 25, 1973 Japan............................. 48-108170

[52] U.S. Cl............................... 307/273; 307/265; 307/268; 328/207
[51] Int. Cl.² ................... H03K 3/284; H03K 5/04; H03K 1/18
[58] Field of Search ........................... 307/273–275, 307/261, 265, 288, 313; 328/207

[56] References Cited
UNITED STATES PATENTS
3,085,165   4/1963   Schaffert et al. .................. 307/273

*Primary Examiner*—John Zazworsky
*Attorney, Agent, or Firm*—Robert E. Burns; Emmanuel J. Lobato; Bruce L. Adams

[57] ABSTRACT

An electronic switch circuit and a pulse generator are connected in series between a positive and a negative power line. The switch circuit is, once triggered, rendered conductive and retains its conductive condition as long as left alone. The pulse generator automatically renders the conductive switch circuit nonconductive at a preset later time. An output can be derived in the form of a pulse from the pulse generator only while the switch circuit is conductive.

4 Claims, 5 Drawing Figures

OUTPUT RETAINING ELECTRONIC CIRCUIT

This invention relates generally to an output retaining electronic circuit, and more particularly to a stable output retaining electronic circuit which once triggered starts to generate an output and retains this condition for a predetermined period.

The output retaining circuit in accordance with the present invention comprises a hook-type electronic switch and a pulse generator which are connected in series between positive and negative power lines. In this specification, the hook-type switch implies a switch circuit having the following characteristic: once a suitable trigger pulse is fed thereto, it is rendered conductive and retains its condition as long as left alone. The pulse generator renders the conductive hook-type electronic switch non-conductive at a predetermined later time. The output can be derived in the form of a pulse from the pulse generator only while the hook-type electronic switch is conductive.

As mentioned above, the output retaining circuit in accordance with the present invention generates the output energy only while the hook-type switch is conductive. Hence, it follows that consumption of electrical energy is substantially null while the hook-type switch is non-conductive, that is, the output is not generated. Furthermore, since the output generation depends upon "on" or "off" operations of the hook-type switch, the overall operation of the circuit is comparatively stable. Still furthermore, since the voltage drop across the hook-type switch is considerably low, the output potential is nearly equal to that of supplied power.

It is a primary object of the present invention to provide a novel and improved output retaining electronic circuit which once triggered begins to generate output energy and remains in this condition for a predetermined period.

Another object of the present invention is to provide a novel and improved output retaining electronic circuit which consumes no electrical energy except while in operation.

A further object of the present invention is to provide a novel and improved output retaining electronic circuit which has a high efficiency of utilization of supplied power.

A still further object of the present invention is to provide a novel and improved output retaining electronic circuit the operation of which is substantially independent of variations in a supplied power potential.

These and other objects, features and many of the attendant advantages of this invention will be appreciated more readily as the invention become better understood by the following detailed description, when considered in connection with the accompanying drawings, wherein like parts in each of the several figures are identified by the same reference characters, and wherein.

Figure 1:
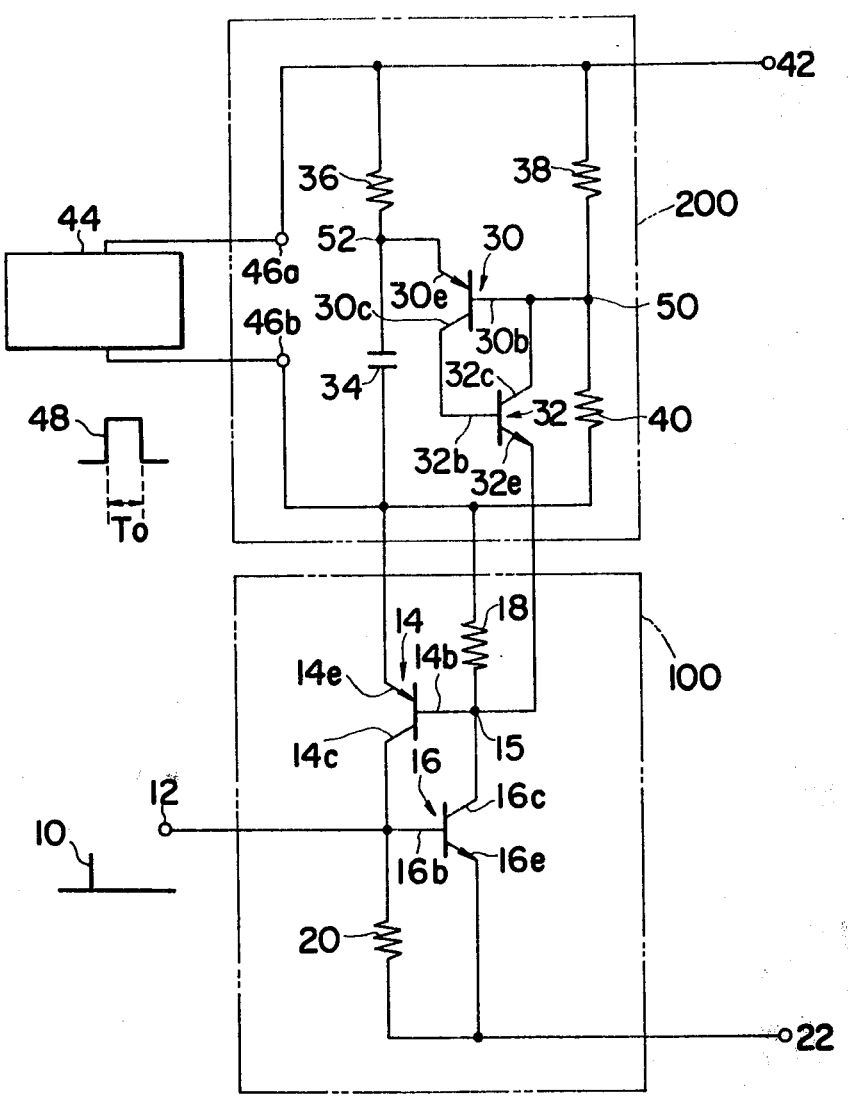
FIG. 1 shows detailed circuit arrangement in accordance with the present invention.

Referring now to FIG. 1, there is shown an output retaining circuit in accordance with the present invention. The output retaining circuit comprises a hook-type switch 100 and a pulse generator 200 as designated by two dash-and-dot line blocks, respectively, inserted between positive and negative power lines 42 and 22. As shown, the hook-type switch 100 includes a PNP transistor 14, an NPN transistor 16, and two resistor 18 and 20. The base 16b of the transistor 16 is connected through the resistor 20 to the negative power line 22, and also connected to an input terminal 12 for receiving a trigger pulse 10 which serves to render the hook-type switch 100 conductive. The resistor 20 is provided to by-pass a reverse current flowing from the collector 16c to the base 16b. The emitter 16e is directly coupled to the negative power line 22. The base 14b and the collector 14c of the transistor 14 are directly connected to the collector 16c and the base 16b of the transistor 16, respectively. The emitter 14e is directly connected to the pulse generator 200, and a junction 15 between the collector 16c and the base 14b is connected directly and through the resistor 18 to the pulse generator 200. The pulse generator 200 consists of a PNP transistor 30, an NPN transistor 32, three resistors 36, 38 and 40, a capacitor 34, and output terminals 46a and 46b. The capacitor 34 and the resistors 36, 38 and 40 jointly comprise a bridge circuit between the positive power line and the hook-type switch. The resistors 38 and 40 form a voltage divider and are inserted between the positive power line 42 and the hook-type switch 100. To a junction 50 between the resistor 38 and 40 are connected the base 30b and the collector 32c of the transistors 30 and 32, respectively. The collector 30c and the base 32b of the respective transistors 30 and 32 are directly coupled to each other. The resistor 36 and the capacitor 34 form a series circuit and are inserted between the positive power line 42 and the hook-type switch 100. To a junction 52 between the resistor 36 and the capacitor 34 is connected the emitter 30e of the transistor 30. Across the series circuit of the resistor 36 and the capacitor 34 are connected the output terminals 46a and 46b to which a load 44 such as a d.c. motor is connected.

In operation, when the trigger pulse 10 is applied to the input terminal 12, viz., the base 16b, a base current begins to flow through the transistor 16 thereby rendering it conductive. Therefore, a d.c. current path formed by the positive power line 42, the resistors 38, 40 and 18, the transistor 16, and the negative power line 22 is completed. This operation in turn renders the transistor 14 conductive in that a base current thereof starts to flow therethrough due to a collector current passing through the transistor 16. On the other hand, a collector current flowing through the transistor 14 serves to maintain the transistor 16 conductive. This means that the hook-type switch 100 is closed and retains its conductive condition as long as left alone, as previously mentioned. When the hook-type switch 100 is thus closed, an output potential develops between the output terminals 46a and 46b, and at the same time the capacitor 34 begins charging through the resistor 36. The potential appearing at the output terminals 46a and 46b is nearly equal to that of the positive power line 42 since the voltage drop in the hook-type switch 100 is comparatively small. In this case, when the voltage appearing across the capacitor 34 exceeds the sum of the voltage drops across the resistor 40 and between the emitter 30e and the base 30b, the transistor 30 is rendered conductive. This in turn makes the transistor 32 conductive in a similar manner mentioned above in connection with the transistors 14 and 16. When both of the transistors 30 and 32 are rendered conductive, the charges stored in the capacitor 34 start to discharge through the transistors 30, 32 and 16. As a result, the potential of the base 14b of the transistor 14 is shifted toward positive to prevent the base current flowing from the base 14b to the collector 14c, thereby rendering the transistor 14 non-conductive. This means that the hook-type switch 100 is forced to open. Summing up the above operation, the hook-type switch 100 is opened solely by the fact that the transistors 30 and 32 are rendered conductive, and the waveform of the output is analogous to that denoted by a reference numeral 48.

In the above, a period $T_o$ from the time when the hook-type switch 100 is closed to the time when the transistors 30 and 32 become conductive is given as follows:

$$V_{34} = V_{cc}\left(1 - \epsilon^{-\frac{T_o}{C_{34}R_{36}}}\right) \quad (1)$$

$$V_{34} = \frac{R_{40}}{R_{38} + R_{40}}V_{cc} + V_{BE} \quad (2)$$

Subtracting the former equation from the latter yields $$\epsilon^{-\frac{T_o}{C_{34}R_{36}}} = 1 - \frac{R_{40}}{R_{38} + R_{40}} - \frac{V_{BE}}{V_{cc}} \quad (3)$$

$$T_o = -C_{34}R_{36} \ln\left(1 - \frac{R_{40}}{R_{38} + R_{40}} - \frac{V_{BE}}{V_{cc}}\right) \quad (4)$$

where
- $V_{34}$: potential across the capacitor 34 in volt
- $V_{cc}$: source potential in volt
- $C_{34}$: capacitance of the capacitor 34 in farad
- $R_{36}$, $R_{38}$ and $R_{40}$: resistances of the resistors 36, 38 and 40 in ohm, respectively
- $V_{BE}$: forward voltage drop between the base 30b and the emitter 30e in volt.

Figure 2A:
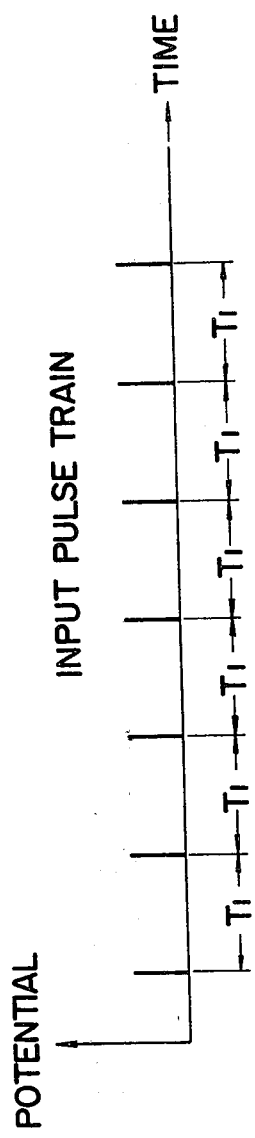
FIGS. 2a and 2b are graphs showing input and output waveforms of the FIG. 1 circuit, respectively.
Figure 2B:
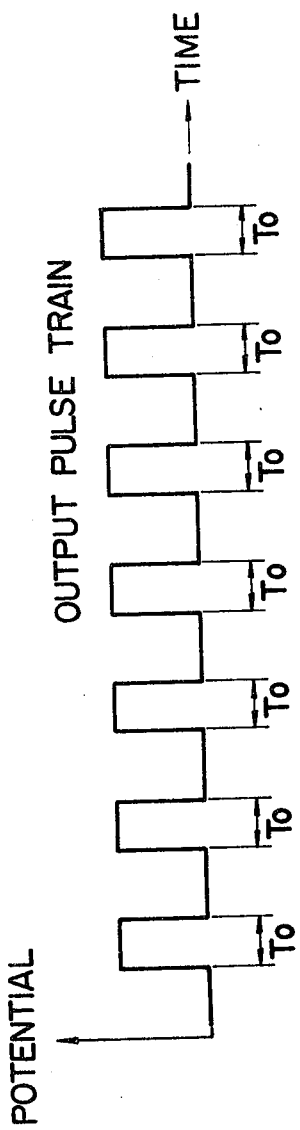

In the foregoing description, only a single pulse 10 is applied to the input terminal 12, however, a pulse train is also applicable as trigger pulses to obtain a train of output pulses as illustrated in FIGS. 2a and 2b.

Reference is made to FIGS. 2a and 2b, wherein an input pulse train with a period $T_1$ is fed to the input terminal 12, whereby an output pulse train of pulses each having a duration $T_o$ ($<T_1$) can be obtained from the output terminals 46a and 46b. Further description as to the circuit operation will be omitted in that it is the same as the foregoing.

It will be understood that the output retaining circuit in accordance with the present invention can be employed as a pulse width converter, and furthermore, since the pulse duration $T_o$ is a constant for fixed values of the circuit components (See equ. 4) the output retaining circuit is able to convert variations of the input pulse period into output potential variations by integrating the output waveshapes.

Figure 3:
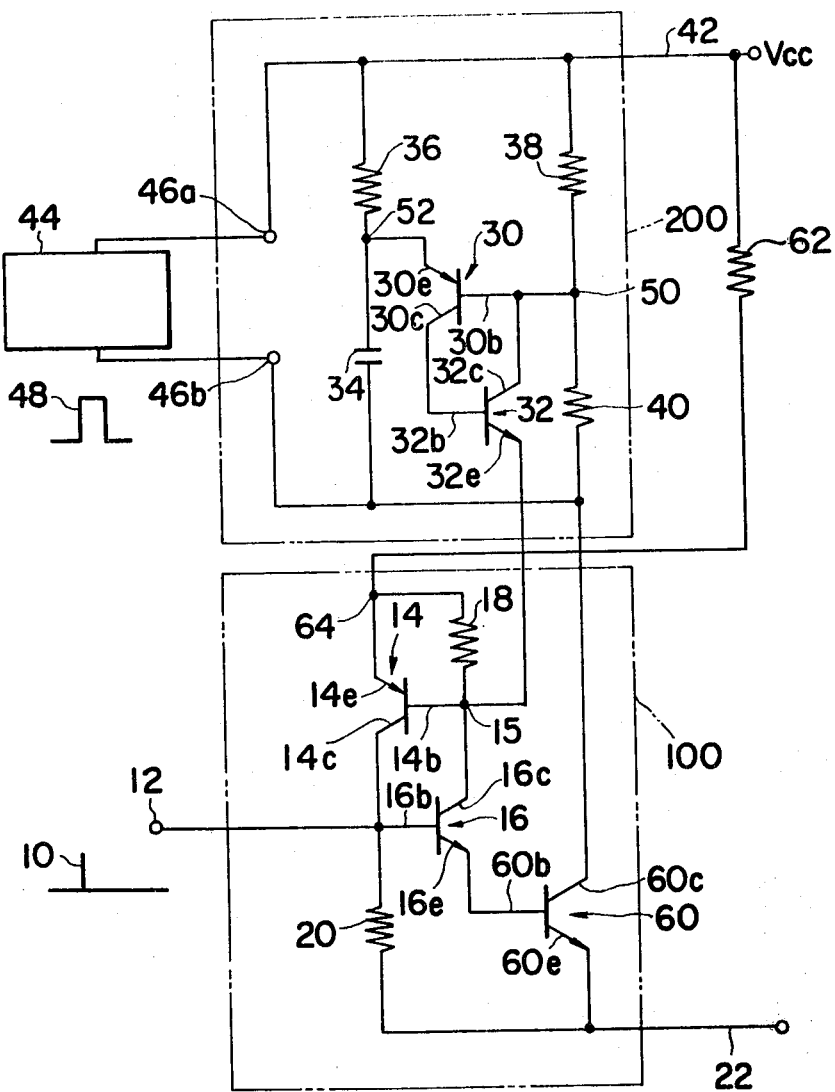
FIG. 3 shows a modification of the circuit shown in FIG. 1 for obtaining a higher efficiency of utilization of supplied power.

In FIG. 3, there is shown a modification of the FIG. 1 circuit for obtaining higher efficiency of utilization of a power source. As shown, an additional transistor 60 is incorporated between the pulse generator 200 and the negative power line 22 such that its base 60b is connected directly to the emitter 16e, and its collector 60c and emitter 60e are connected to the pulse genrator 200 and the negative power line 22, respectively. Furthermore, an additional resistor 62 is inserted between the positive power line 42 and a junction 64. In this case, it is to be noted that the emitter 14e and the resistor 18 are not connected to the pulse generator 200 as in FIG. 1 but to the positive power line 42 through the newly added resistor 62. The operation of the FIG. 3 circuit is analogous to that of the FIG. 1 circuit except that the output potential of the FIG. 3 circuit approaches the positive power line potential more closely than in FIG. 1 circuit. This is because the saturation voltage of the transistor 60 is relatively lower than the sum of those of the transistors 14 and 16. By way of example, the former is within the range from 0.2 to 0.3 volts and on the contrary the latter about 1.0 volt.

Figure 4:
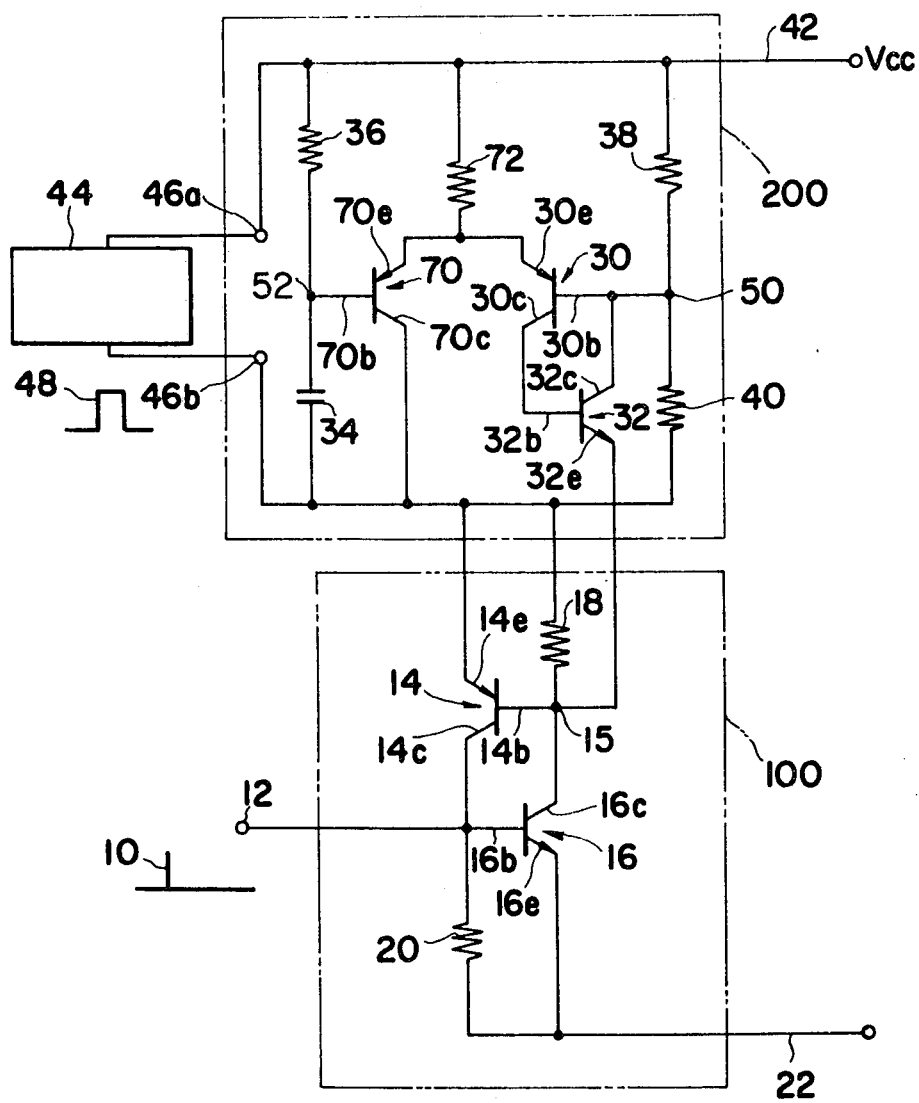
FIG. 4 shows another modification of the circuit shown in FIG. 1 obtaining a greater reliability of operation.

FIG. 4 shows another modification of the FIG. 1 circuit for removing the undesirable effect of $V_{BE}$ of the equation (4) on the pulse duration $T_o$. As shown in FIG. 4, an additional transistor 70 and a resistor 72 are interposed between the positive power line 42 and the hook-type switch 100 such that the forward potential drop between the emitter 70e and the base 70b cancel the $V_{BE}$ of the transistor 30. Therefore, the equation (4) can be rewritten as follows:

$$T_o = -C_{34}R_{36} \ln\left(1 - \frac{R_{40}}{R_{38} + R_{40}}\right) \quad (5)$$

This means that the period $T_o$ does not depend on $V_{BE}$, in other words, it is not adversely affected by variations in the source potential.

In the foregoing description it should be noted that the PNP transistor 14 and the NPN transistor 16 of the hook-type switch 100 are replaceable with each other, and this statement is true for the transistors 30 and 32 of the pulse generator 200. In addition, the NPN transistor 60 of FIG. 3 can be replaced with a PNP type and also the PNP transistor 70 of FIG. 4 with an NPN type.

What is claimed is:

1. An electronic circuit, for generating an output pulse having a predetermined duration in response to an input trigger pulse applied thereto, comprising:
   an electronic switch comprised of a pair of complementary transistors wherein the base of each of said transistors is connected to the collector of the respective other one of said transistors, the base of a first of said transistors receiving in operation a trigger pulse to render said first transistor conductive to flow a collector current therethrough and thereby bias a second of said transistors to conduct and flow a collector current therethrough to bias said first transistor and maintain said first transistor in a conductive state after the termination of the trigger pulse; and
   a pulse generator comprising a bridge circuit comprised of three resistors and a capacitor and having four nodes including a first node defined by the junction of said capacitor with a first of said resistors, a second node defined by the junction of said first resistor with a second of said resitors, a third node defined by the junction of said second resistor with the third of said resistors, and a fourth node defined by the junction of said capacitor and said third resistor, and a normally non-conductive control circuit having a pair of principal conduction electrodes and a control electrode, wherein a first of said conduction electrodes is connected to said first node, the second of said conduction electrodes is connected to the base of said second transistor in said electronic switch, and said control electrode is connected to said third node, and said fourth node is connected to the base and emitter of said second transistor in said electronic switch; whereby a potential difference applied across said second node and the emitter of said first transistor is ineffective to develop a current through said electronic switch and said pulse generator when said first and said second transistors are nonconductive, a trigger pulse applied to the base of said first transistor rendering said first and said second transistors conductive and thereby completing conductive paths respectively defined by said second and said third resistors and said first transistor, and said first resistor, said capacitor and said second transistor to develop an output voltage between said second and said fourth nodes and to charge said capacitor, said capacitor charging to a certain potential value relative to the third node potential value thereby rendering said control circuit conductive between said pair of principal conduction electrodes to bias said second transistor to render said second and said first transistors non-conductive to terminate the current flow through said electronic switch and said pulse generator to reduce the output voltage to zero a predetermined time after the trigger pulse was applied.

2. An electronic circuit according to claim 1, wherein said control circuit comprises another pair of complementary transistors wherein the base of each of said another transistors is connected to the collector of the respective other one of said another transistors, the two emitters of said another transistors defining said principal conduction electrodes, and the base of the one of said another transistors having an emitter connected to said first node defining said control electrode.

3. An electronic circuit according to claim 2, further comprising a fifth transistor having a base connected to the emitter of said first transistor, and having a collector connected to said fourth node.

4. An electronic circuit according to claim 2, wherein said control circuit comprises a third transistor having a base connected to said first node, a collector connected to said fourth node, and an emitter connected to said second node and to the emitter of the one of said another transistors the base of which is connected to said third node.

* * * * *